US006954723B2

(12) United States Patent
Watanabe et al.

(10) Patent No.: US 6,954,723 B2
(45) Date of Patent: Oct. 11, 2005

(54) DEVICE SIMULATION METHOD, DEVICE SIMULATION SYSTEM AND DEVICE SIMULATION PROGRAM

(75) Inventors: Hiroshi Watanabe, Yokohama (JP); Kazuya Matsuzawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 710 days.

(21) Appl. No.: 09/956,126

(22) Filed: Sep. 20, 2001

(65) Prior Publication Data

US 2002/0116162 A1 Aug. 22, 2002

(30) Foreign Application Priority Data

Sep. 29, 2000 (JP) ....................................... 2000-299454

(51) Int. Cl.$^{7}$ .......................... G06F 17/10; G06F 17/50

(52) U.S. Cl. .............................. 703/2; 703/14; 716/20; 716/4

(58) Field of Search .......................... 703/2, 14; 716/4, 716/20; 385/122

(56) References Cited

U.S. PATENT DOCUMENTS 5,684,723 A * 11/1997 Nakadai ...................... 716/20
6,640,034 B1 * 10/2003 Charlton et al. ............ 385/122
6,778,746 B2 * 8/2004 Charlton et al. ............ 385/122

OTHER PUBLICATIONS

Zivanov et al., Determination of Average effective Masses of Majority Carriers as Function of Impurity Concentrations for Heavily Doped GaAs, IEEE, Semiconductor, Oct. 1995, pp. 103–106.*

Rinaldi, Modeling of Minority–Carrier Transport in Semiconductor Regions with Position–Dependent Material Parameters ar Arbitrary Injection Levels, IEEE Transactions on Electron Devices, vol. 43, No. 8, Aug. 1996, pp. 1256–1263.*

Myers et al., Band–Gap Narrowing and III–V Heterostructure FETs, IEEE, Int. Electron Devices Meeting, Dec. 1990, pp. 759–762.*

Kuzmin et al., Analysis and Simulation of Insulated Gate Bipolar Transistor with Buffer N'–Layer, IEEE, 5th Int. Conference on Power Electronics and Variable–speed Drives, Oct. 1994, pp. 24–28.*

Stollwerck et al., Characterization and Simulation of GaSb Device–Related Properties, IEEE Transactions on Electron Devices, vol. 47, No. 2, Feb. 2000, pp. 448–457.*

(Continued)

*Primary Examiner*—Russell Frejd
(74) *Attorney, Agent, or Firm*—Oblon, Spivak, McClelland, Maier & Neustadt, P.C.

(57) ABSTRACT

There is disclosed a method comprising: calculating a band gap narrowing of a semiconductor and an ionization rate of an impurity in an equilibrium state; calculating a movable electric charge density contributing to transportation of an electric charge inside the semiconductor by solving a Poisson equation and a movable electric charge continuous equation based on the calculated ionization rate in the equilibrium state; calculating said band gap narrowing and said ionization rate in a non-equilibrium state, taking presence of a potential into consideration, based on the calculated movable electric charge density; and repeating the calculation of the movable electric charge density by solving the Poisson equation and the movable electric charge continuous equation based on the ionization rate and the band gap narrowing in said non-equilibrium state, and the calculation of said band gap narrowing and said ionization rate based on the calculation result, until the ionization rate and the band gap narrowing in said non-equilibrium state converge.

22 Claims, 5 Drawing Sheets

OTHER PUBLICATIONS

Brand et al., Two–Dimensional Simulation of Thermal Runaway in a Nonplanar GTO–Thyristor, IEEE Transactions on Electron Devices, vol. 42, No. 12, Dec. 1995, pp. 2137–2146.*

Watanabe et al., Scaling Effects on Gate Leakage Current, IEEE Transactions on electron Devices, vol. 50, No. 8, Aug. 2003, pp. 1779–1784.*

Andreas Schenk, "Finite–Temperature Full Random–Phase Approximation Model of Band Gap Narrowing for Silicon Device Simulation", Journal of Applied Physics, Oct. 1, 1998, vol. 84, No. 7, pp. 3684–3695.

* cited by examiner

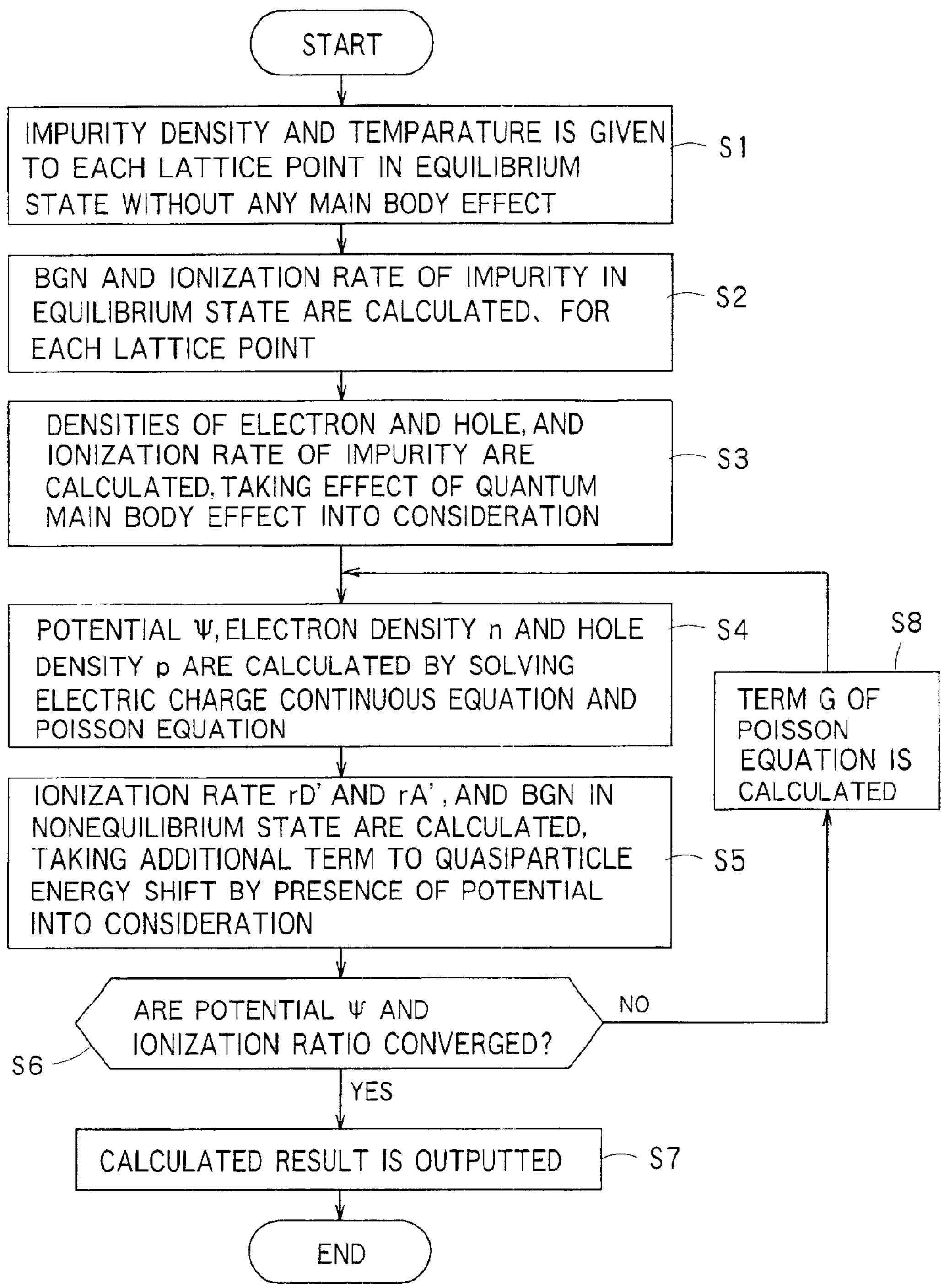
F I G. 1

DIAGRAM SHOWING CONVERGENCE OF POISSON EQUATION

SECTIONAL VIEW OF nMOSFET FOR USE IN SIMULATION

DEPENDENCE OF BGN ON GATE VOLTAGE

DEPENDENCE OF DONOR IONIZATION RATE ON GATE VOLTAGE

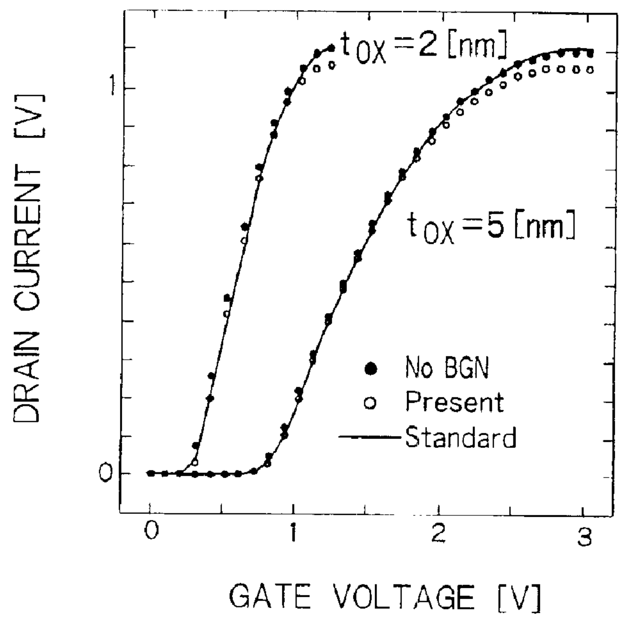
F I G. 6
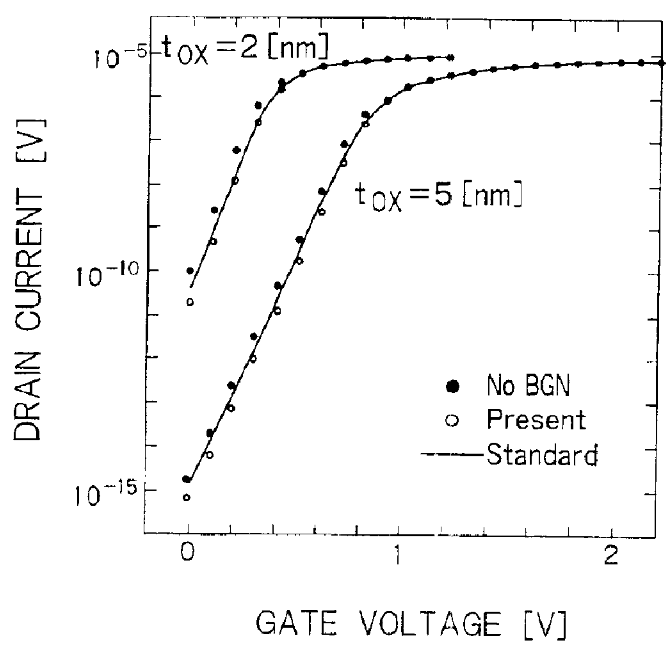
F I G. 7

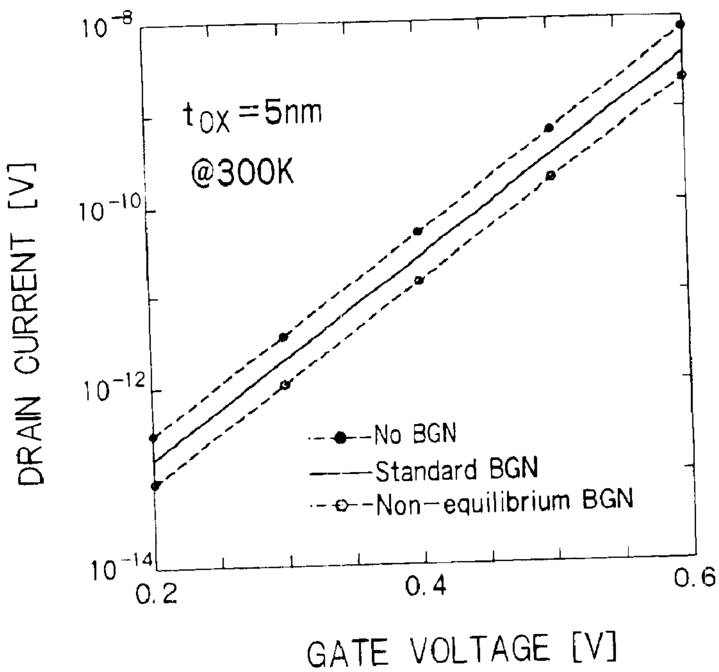
F I G. 8
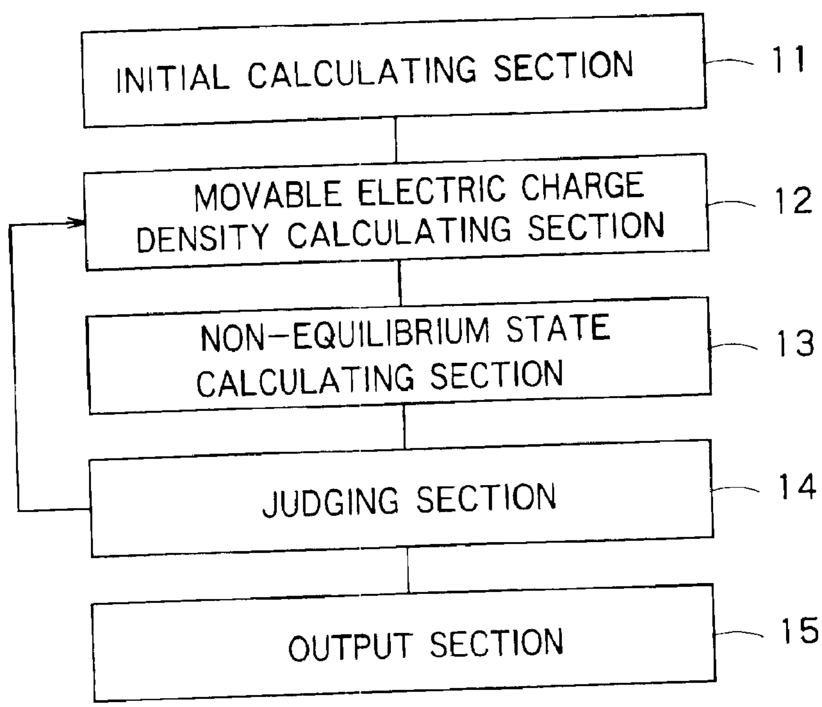
F I G. 9

DEVICE SIMULATION METHOD, DEVICE SIMULATION SYSTEM AND DEVICE SIMULATION PROGRAM

CROSS REFERENCE TO RELATED APPLICATIONS

This application is based upon and claims the benefit of priority from the prior Japanese Patent Applications No. 2000-299454, filed on Sep. 29, 2000, the entire contents of which are incorporated herein by reference.

BACKGROUND OF THE INVENTION

1. Field of the Invention

The present invention relates to a device simulation method, device simulation system, and device simulation program for calculating a movable electric charge density inside a semiconductor device, ionization rate of an impurity injected into the semiconductor device, a band gap narrowing and an energy band gap.

2. Related Background Art

With miniaturization of a semiconductor device, a decrease of an energy band of a semiconductor, that is, a so-called band gap narrowing (BGN), and a change of ionization rate of an impurity have had a large influence on an element property. A physical model for reproducing experiment data of the BGN in a numerical calculating manner has been already proposed. However, these models cannot deal with a simulation in case that the devise in which the current flows is ON. The reason is that a conventional BGN model is configured irrespective of external factors such as a current and a potential that modulate inside the semiconductor, and it is principally possible to calculate neither the BGN nor the ionization rate of the impurity in a non-equilibrium state in which the current flows inside the semiconductor.

Moreover, when trying to simultaneously calculate the ionization rate and the BGN, any artifice for enhancing convergence, which has been used in a conventional device simulator, such as adjustment of a control coefficient does not become valid.

Such a situation was not assumed heretofore. The physical model for calculating the BGN has been devised to reproduce the experimented data of the BGN in disregard for non-equilibrium of the ionization rate of the impurity. Therefore, the BGN or the ionization rate of the impurity inside the semiconductor cannot be calculated in any self-consistent manner in accordance with the current or the potential inside the semiconductor.

A technique is necessary for device simulation for a next-generation circuit to calculate not only the BGN and the ionization rate of the impurity in a self consistent manner but also a transport equation of movable electric charge and a Poisson equation, by setting the current and potential given from the electrode of the semiconductor device as boundary conditions.

SUMMARY OF THE INVENTION

The present invention has been developed in consideration of this respect, and an object thereof is to provide a device simulation method, a device simulation system and a device simulation program in which simulation can be performed with high precision and good convergence.

According to the present invention, there is provided a device simulation method comprising: calculating a band gap narrowing of a semiconductor and an ionization rate of an impurity in an equilibrium state; calculating a movable electric charge density contributing to transportation of an electric charge inside the semiconductor by solving a Poisson equation and a movable electric charge continuous equation based on the calculated ionization rate in the equilibrium state; calculating said band gap narrowing and said ionization rate in a non-equilibrium state, taking presence of a potential into consideration, based on the calculated movable electric charge density; and repeating the calculation of the movable electric charge density by solving the Poisson equation and the movable electric charge continuous equation based on the ionization rate and the band gap narrowing in said non-equilibrium state, and the calculation of said band gap narrowing and said ionization rate based on the calculation result, until the ionization rate and the band gap narrowing in said non-equilibrium state converge.

Furthermore, the band gap narrowing is due to mainly a quantum many-body effect. Also, it is easy to extend the impurity band and so on if necessary.

According to the present invention, the band gap narrowing inside the semiconductor and the ionization rate of the impurity are treated as some function of both the carriers and the potential, and the band gap narrowing and ionization rate are calculated in a self consistent manner, so that device simulation with high precision and good convergence is realized.

BRIEF DESCRIPTION OF THE DRAWINGS

FIG. 1 is a flowchart showing a processing procedure of a device simulation method according to the present invention.

FIG. 6 is a diagram showing a current property of nMOSFET shown in FIG. 3.

FIG. 7 is a diagram showing an electric property of FIG. 6 by a single log plot.

FIG. 8 is a partial enlarged view of FIG. 7.

FIG. 9 is a block diagram showing a schematic constitution of a device simulation system.

DESCRIPTION OF THE PREFERRED EMBODIMENTS

Figure 2:
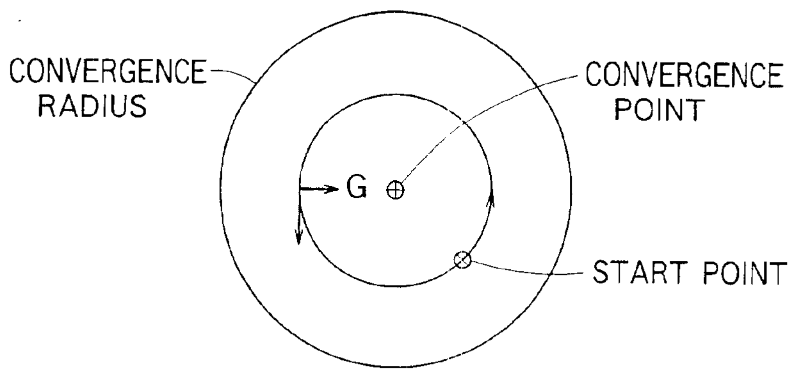
FIG. 2 is a diagram showing a convergence of a Poisson equation.

A device simulation method and device simulation system according to the present invention will more specifically be described hereinafter with reference to the drawings.

FIG. 1 is a flowchart showing a processing procedure of the device simulation method according to the present invention. First, an impurity density and temperature are given for each lattice point in an equilibrium state without any quantum many-body effect (step S1). Subsequently, the BGN and an ionization rate of an impurity are calculated in the equilibrium state at each lattice point (step S2).

A processing of the step S2 will be described hereinafter in detail. A neutral condition of an electric charge in the equilibrium state is expressed by equation (1).

$$N^+_D - N^-_A - p_0 - n_0 = 0 \quad (1)$$

According to Fermi-Dirac statistics, an electron density $n_{00}$ and hole density $p_{00}$ in which the quantum many-body effect is ignored are expressed by equations (2) and (3).

$$n_{00} = N_c \frac{2}{\sqrt{\pi}} F_{\frac{1}{2}}\left(\frac{E_{F00} - E_{C00}}{k_B T}\right) \quad (2)$$

$$p_{00} = N_V \frac{2}{\sqrt{\pi}} F_{\frac{1}{2}}\left(\frac{E_{V00} - E_{F00}}{k_B T}\right) \quad (3)$$

Additionally, $N_c$ denotes an effective density of states in conduction band, $N_v$ denotes an effective density of states in valence band, $F_{1/2}$ denotes a Fermi-Dirac integration, $E_{F00}$ denotes a Fermi level in which quantum many-body effect is ignored, $E_{C00}$ denotes a conduction band edge in which the quantum many-body effect is ignored, and $E_{V00}$ denotes a valence band edge in which the quantum many-body effect is ignored. When an energy cap $EG_{int}$ ignoring the quantum many-body effect is used, equation (4) is established.

$$E_{V00} = E_{C00} - EG_{int} \quad (4)$$

Donor ion density $N^+_D$ and acceptor ion density $N^-_A$ are expressed by equations (5) and (6), respectively.

$$N^+_D = r_{D00} \times N_D \quad (5)$$

$$N^-_A = r_{A00} \times N_A \quad (6)$$

Additionally, $N_D$ denotes a donor density, $N_A$ denotes an acceptor density, $r_{D00}$ denotes an ionization rate of the donor, and $r_{A00}$ denotes an ionization rate of the acceptor in case that a neutral condition of the equation (1) is established.

According to the Fermi-Dirac statistics, $r_{D00}$ and $r_{A00}$ are expressed by equations (7) and (8).

$$r_{D00} = \frac{1}{1 + 2\exp\left(\frac{E_{F00} - E_D}{k_B T}\right)} \quad (7)$$

$$r_{A00} = \frac{1}{1 + 4\exp\left(\frac{E_A - E_{F00}}{k_B T}\right)} \quad (8)$$

Additionally, $E_D$ denotes a donor level, and $E_A$ denotes an acceptor level. When an ionization energy $\epsilon_D$ of the donor and an ionization energy $\epsilon_A$ of the acceptor are used, equations (9) and (10) are established.

$$E_D = E_{C00} - \epsilon_D \quad (9)$$

$$E_A = E_{V00} + \epsilon_A \quad (10)$$

When the equation (1) is solved by using the equations (2) to (10), Fermi energy ($E_{F00} - E_{C00}$) is obtained.

Subsequently, densities of electrons and holes and ionization rate are calculated (step S3) by taking an influence of quantum many-body effect into consideration.

First, the influence of quantum many-body effect is introduced using equations (11) and (12).

$$E_F - E_C = E_{F00} - E_{C00} - \Delta_{e0}(ef_0) \quad (11)$$

$$E_V - E_F = E_{V00} - E_{F00} - \Delta_{h0}(ef_0) \quad (12)$$

Additionally, $\Delta_{e0}$ denotes an energy shift of the electron, and $\Delta_{h0}$ denotes the energy shift of the hole. The influence can be expressed in a form which regards a shift ($ef_0$) of a Fermi surface by the quantum many-body effect as a variable. The densities ($n_0$, $p_0$) of the electron and hole corrected quantum mechanically are expressed by equations (13) and (14).

$$n_0 = N_c \frac{2}{\sqrt{\pi}} F_{\frac{1}{2}}\left(\frac{E_{F00} - E_{C00} - \Delta_{e0}(ef_0)}{k_B T}\right) \quad (13)$$

$$p_0 = N_V \frac{2}{\sqrt{\pi}} F_{\frac{1}{2}}\left(\frac{E_{V00} - E_{F00} - \Delta_{h0}(ef_0)}{k_B T}\right) \quad (14)$$

It is seen from the equations (13) and (14) that $n_0$ and $p_0$ are functions of $ef_0$. Similarly, the ionization rate in the equilibrium state is also subjected to quantum correction as shown in equations (15) and (16).

$$r_{D0}(ef_0) = \frac{1}{1 + 2\exp\left(\frac{E_{F00} + ef_0 - E_D}{k_B T}\right)} \quad (15)$$

$$ra(ef_0) = \frac{1}{1 + 4\exp\left(\frac{E_A - E_{F00} - ef_0}{k_B T}\right)} \quad (16)$$

In the equations, $E_{F00} - E_{C00}$ is known. Therefore, when the equations (11) to (16) are substituted to the equation (1), the equation (1) turns to an equation with $ef_0$ as one variable. In this manner, $\Delta_{e/h0}(ef_0)$ is numerically obtained.

In an actual device, the neutral condition of the electric charge is hardly established. If there is a transport of the electric charge at this time, a continuous condition of the electric charge has to be satisfied in each point of the device divided by mesh. Therefore, an electron density n and hole density p have the respective local equilibrium values deviating from corresponding $n_0$ and $p_0$ in the equilibrium state.

Moreover, presence of a potential $\Psi$ causes deviation from the equilibrium state. Therefore, in order to obtain practical algorithm for device simulation, the aforementioned theory has to be expanded to a local equilibrium system.

Subsequently, a continuous equation of the electric charge and Poisson equation are solved to calculate the potential $\Psi$, electron density n and hole density p (step S4).

Here, the continuous equation of the electric charge (transport equation) is expressed by equations (17) and (18).

$$\frac{\partial n}{\partial t} = G_n - U_n + n\mu_n \cdot \vec{\nabla} E + \mu_n E \cdot \vec{\nabla} n + D_n \cdot \vec{\nabla}^2 n \quad (17)$$

$$\frac{\partial p}{\partial t} = G_p - U_p + p\mu_p \cdot \vec{\nabla} E - \mu_p E \cdot \vec{\nabla} p + D_p \cdot \vec{\nabla}^2 p \quad (18)$$

On the other hand, the Poisson equation is expressed by the equations (19) and (20).

$$\vec{\nabla} \cdot (\epsilon \vec{\nabla} \Psi) = -\rho \quad (19)$$

$$\rho = q\{N^+_D(\Psi) - N^-_A(\Psi) + p(\Psi) - n(\Psi)\} \quad (20)$$

The numerically calculated, n, p, $\Psi$ are given to simultaneously satisfy the equations (17) to (20). Additionally, E denotes an electric field, and is proportional to differential of the potential $\Psi$. In the equations, $\epsilon$ denotes a permittivity of a semiconductor, $\mu_{n/p}$ denotes a mobility, $D_{n/p}$ denotes a diffusion coefficient, $G_{n/p}$ denotes a generation rate of electrons/holes, and $U_{n/p}$ denotes a recombination rate of the carrier.

Ionization rates $r'_D$, $r'_A$ and BGN in a non-equilibrium state are calculated based on n, p, $\Psi$ obtained in this manner, and taking equation (21) as an additional term to the quasiparticle energy shift by the presence of the potential (step S5).

$$\delta\Delta_{le/h}(\Psi) = \Delta_{e/h}(n, p, N_D^+, N_A^-) - \Delta_{e/h}(n_0, p_0, N_D^+, N'^-_A) \tag{21}$$

Additionally, since equations (22) and (23) are established, calculating methods of ionization rates $r'_D$, $r'_A$ in the non-equilibrium state are as follows.

$$N'^+_D = r'_D \times N_D \tag{22}$$

$$N'^-_A = r'_A \times N_A \tag{23}$$

Thus, the ionization rates are different from that obtained by the equations (5) and (6).

First, equations (24) and (25) are solved to numerically calculate $\Delta'_n$ and $\Delta'_p$.

$$n = N_C \frac{2}{\sqrt{\pi}} F_{\frac{1}{2}}\left(\frac{\Delta'_n}{k_B T}\right) \tag{24}$$

$$p = N_V \frac{2}{\sqrt{\pi}} F_{\frac{1}{2}}\left(\frac{\Delta'_p}{k_B T}\right) \tag{25}$$

Here, assuming that equations (26) and (27) are established, equations (28) and (29) are calculated.

$$\Delta'_D = \Delta'_n + \epsilon_D + \Delta_{e0}(ef_0) + ef_0 \tag{26}$$

$$\Delta'_A = \Delta'_p + \epsilon_A + \Delta_{h0}(ef_0) - ef_0 \tag{27}$$

$$r'_D = \frac{1}{1 + 2\exp\left(\frac{\Delta'_D}{k_B T}\right)} \tag{28}$$

$$r'_A = \frac{1}{1 + 4\exp\left(\frac{\Delta'_A}{k_B T}\right)} \tag{29}$$

Subsequently, it is judged whether or not the potential $\Psi$ and ionization rate have converged (step S6). When the potential and ionization rate converge, a calculation result is outputted (step S7). When the potential and ionization rate do not converge, term G of the Poisson equation is calculated in the following procedure (step S8). The processing of and after the step S4 is carried out again based on the preceding calculation result.

Here, the Poisson equation in a device simulator is expressed by equation (30) with 2-dimensional analysis (Y=0).

$$F_\varphi \equiv \delta x \cdot \left(\varepsilon_N \varphi_N - \frac{\varphi_P}{\Delta z_N} + \varepsilon_S \varphi_S - \frac{\varphi_P}{\Delta z_S}\right) + \delta z \cdot \left(\varepsilon_E \varphi_E - \frac{\varphi_P}{\Delta x_E} + \varepsilon_W \varphi_W - \frac{\varphi_P}{\Delta x_P}\right) + \delta x \delta z q \cdot (p - n + r_D \times N_D - r_A \times N_A) = 0 \tag{30}$$

Additionally, it is unrealistic to directly solve the equation (30), because excessive load is applied to CPU. Therefore, a differential form as shown in equation (31) is used.

$$\frac{\partial F_\varphi}{\partial \varphi_P} = -\frac{\delta x \varepsilon_N}{\Delta z_N} - \frac{\delta x \varepsilon_S}{\Delta z_S} - \frac{\delta x \varepsilon_E}{\Delta x_E} - \frac{\delta x \varepsilon_W}{\Delta x_W} + \delta x \delta z q \cdot \left(\frac{\partial p}{\partial \varphi_P} - \frac{\partial n}{\partial \varphi_P} + G\right) = 0 \tag{31}$$

Additionally, G in equation (31) is expressed by equation (32).

$$G = N_D \times \frac{\partial r_D}{\partial \varphi} - N_A \times \frac{\partial r_A}{\partial \varphi} \tag{32}$$

Here, if G=0, it causes serious situation that the calculation does not converge. FIG. 2 is a diagram showing a convergence of the Poisson equation.

Term G shown in the equation (32) is a normal vector directed to a convergence point ($\partial Fp/\partial \psi p = 0$). If neglecting the term G, as shown in FIG. 2, the convergence point is not approached, although a tangent component of $\partial Fp/\partial \psi p$ is changed.

In this manner, in the present embodiment, the BGN and ionization rate are treated as functions of the potential, and the aforementioned term G is taken into account, thereby allowing the Poisson equation and the movable electric charge continuous equation to assuredly converge and precisely calculating the BGN and the ionization rates.

The calculated BGN is used to obtain a threshold voltage of MOSFET and a gate leak current. That is, when the BGN is precisely calculated, results of device simulations become more precise.

A result of calculation of the BGN in the aforementioned calculating method will be described hereinafter.

Figure 3:
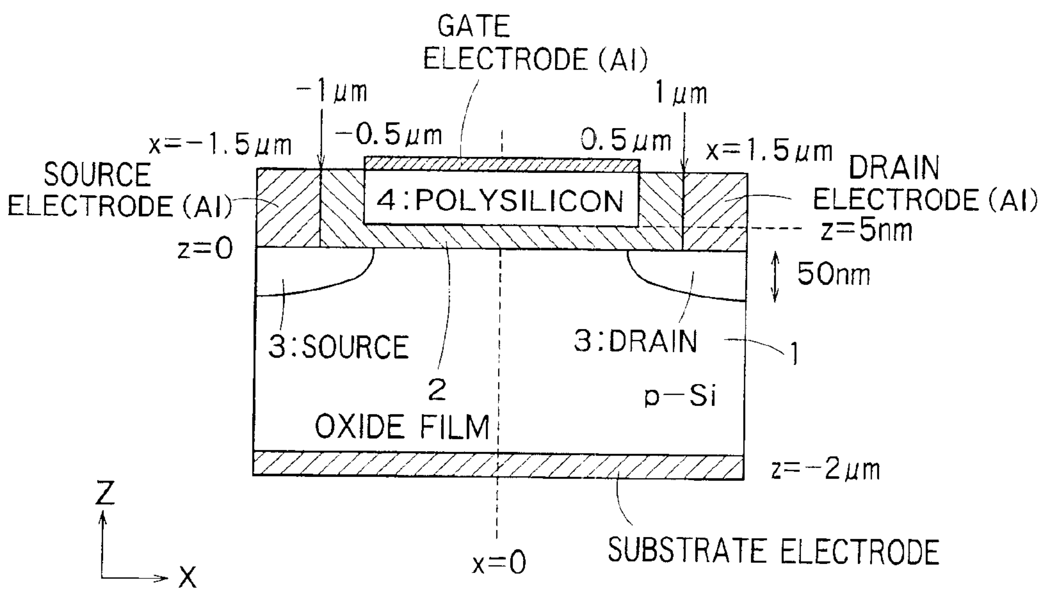
FIG. 3 is a sectional view of nMOSFET for use in simulation.

FIG. 3 is a sectional view of nMOSFET for use in the simulation. A Si substrate 1 disposed between Z=−2 μm and Z=0 μm is doped with boron having an ionization energy of 48.3 meV by $10^{18}$ $cm^{-3}$, and an oxide film 2 is formed between Z=0 nm and Z=5 nm.

The impurity of a diffusion layer 3 is phosphorus with an ionization energy of 45 meV. A density is set to $10^{20}$ $cm^{-3}$ at maximum, and $10^{18}$ $cm^{-3}$ in its tail. A gate polysilicon 4 is doped with phosphorus similarly as the diffusion layer 3, and has a density of $10^{20}$ $cm^{-3}$.

Figure 4:
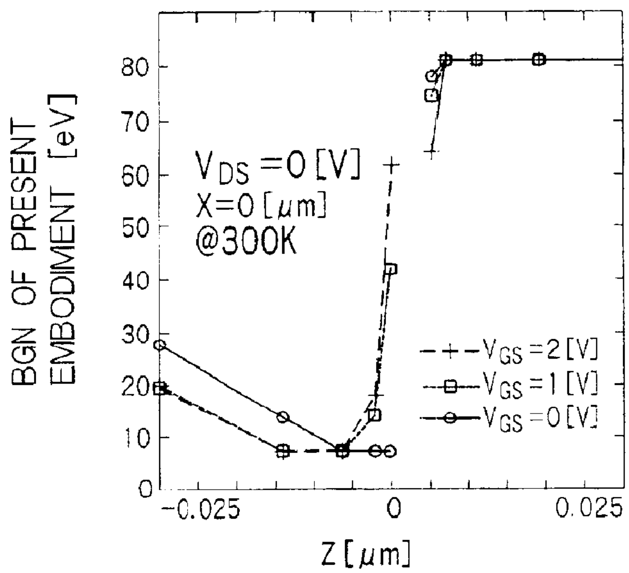
FIG. 4 is a diagram showing dependence of BGN on a gate voltage as seen in a section of a gate middle cut vertically to an interface.

FIG. 4 is a diagram showing a gate voltage dependence of BGN on a gate voltage as seen in a section (X=0 μm) of a gate middle cut vertically to an interface in a center of the gate.

With applying of the gate voltage, the BGN decreases in the vicinity of Z=0.005 μm. This reflects a decrease of the carrier density by depletion of a gate. Conversely, with the applying of the gate voltage, the BGN increases in the vicinity of a substrate interface (Z=0 μm). This reflects an increase of the electron density due to formation of an inversion layer.

Thus, the calculation result of the BGN according to the present embodiment is sensitive to a change of the carrier density.

Figure 5:
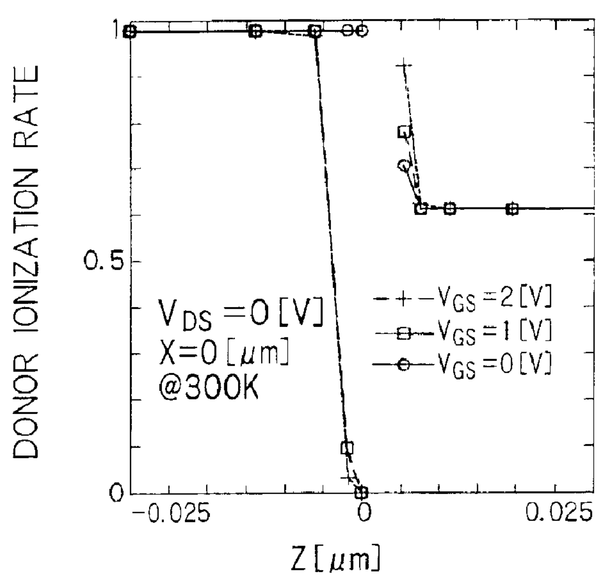
FIG. 5 is a diagram showing a calculation result of a donor ionization rate as seen in the same section as that of FIG. 4.

FIG. 5 is a diagram showing the calculation result of a donor ionization rate as seen in the same section as that of FIG. 4. With the applying of the gate voltage, the ionization rate increases in the vicinity of Z=0.005 μm. This reflects the decrease of the carrier density by depletion of the gate.

As described above, when a large number of electrons exist around the donor, the ionization rate of the donor tends to drop. Conversely, with the applying of the gate voltage, the ionization rate rapidly decreases in the vicinity of the substrate interface (Z=0 μm). This reflects the increase of the electron density due to formation of the inversion layer. Such a result is obtained only by the introduction of the G term.

As seen from FIG. 5, the calculation result of the ionization rate according to the present embodiment is sensitive to the change of the carrier density. This calculation result is never obtained in conventional simulation program.

FIG. 6 is a diagram showing simulated current voltage characteristics of nMOSFET having structure shown in FIG. 3 with their oxide thicknesses are 2 nm and 5 nm, respectively.

In case of the film thickness of $t_{0X}$=5 nm, a sub-threshold region exists in the vicinity of 0.5 V. In case of the film thickness of $t_{0X}$=2 nm, the region exists in the vicinity of 0.2 V. For comparison, the calculation result (black circle) in which the BGN is ignored, and the calculation result of a conventional standard BGN model (solid line) are shown. Moreover, FIG. 7 rewrites FIG. 6 by a semi log plot.

As seen from FIG. 7, three lines of each oxide thickness become parallel straight lines in a low-bias region. A difference of these straight lines along the abscissa can be regarded as a difference of the threshold voltage. FIG. 8 shows enlarged data of this portion (film thickness $t_{0X}$=5 nm).

In FIG. 8, as compared with the case (black circle) in which the BGN is ignored, the threshold voltage increases by about 30 mV with use of the conventional standard BGN model (black solid line). Further, as seen from the calculation result (white circle) according to the present embodiment, the threshold voltage further increases by about 30 mV.

This is because in the calculation using the conventional BGN model, the ionization rate of the impurity in the gate polysilicon is assumed to be "1", and the electron density is over-estimated. Even if a fitting of an IV characteristic (gate voltage-drain current characteristic) is tried using the ionization rate as an adjustable parameter in order to compensate a deviation of the threshold voltage by incorrectness of the ionization rate, the ionization rate itself is a constant, and the term G disappears in equation (32). In this case, it is impossible to reproduce variation of the ionization rate as shown in FIG. 5, and it is extremely difficult to converge the Poisson equation in the non-equilibrium state.

To avoid this difficulty, even if the BGN is calculated in the equilibrium state under conditions of given bias and current, and the Poisson equation is converged, when boundary conditions such as the current and potential in an electrode are changed, it is impossible to fit the IV property with the same ionization rate, thereby considerably deteriorating reliability of the simulation.

In a semiconductor device doped with the impurity of a high density, the influence of the BGN or the ionization rate of the impurity on simulation precision cannot be ignored.

On the other hand, in the present embodiment, the Poisson equation is solved taking the term G shown in equation (32) into consideration. While the boundary conditions in the electrode are arbitrarily changed, and the current flows in the device, the simulation is carried out. The BGN and ionization rate of the impurity can accurately be calculated.

The aforementioned device simulation method may be realized by hardware or software. For example, FIG. 9 is a block diagram showing a schematic constitution of a device simulation system in which the aforementioned device simulation method is realized by hardware.

The device simulation system of FIG. 9 comprises: an initial calculating section 11 for calculating the band gap narrowing of the semiconductor and the ionization rate of the impurity in the equilibrium state; a movable electric charge density calculating section 12 for solving the Poisson equation and the movable electric charge continuous equation, and calculating the movable electric charge density for transporting the electric charge in the semiconductor based on the calculated ionization rate in the equilibrium state; a non-equilibrium state calculating section 13 for calculating the band gap narrowing and ionization rate in the non-equilibrium state based on the calculated movable electric charge density, taking a shift of the quantum many-body effect by presence of the potential into consideration, and a judging section 14 for judging whether or not the ionization rate and the band gap narrowing in the non-equilibrium state have converged; and an output section 15 for outputting the calculation result of the non-equilibrium state calculating section.

The movable electric charge density calculating section 12 repeats a processing of solving the Poisson equation and movable electric charge continuous equation and calculating the movable electric charge density based on the ionization rate and band gap narrowing in the non-equilibrium state, until the ionization rate and band gap narrowing in the non-equilibrium state converge. Moreover, the non-equilibrium state calculating section 13 repeats the calculation of the band gap narrowing and ionization rate based on the calculation result of the movable electric charge density calculating section, until the ionization rate and band gap narrowing in the non-equilibrium state converge. If judging section 14 judges that the ionization rate and band gap narrowing converge, the output section 15 outputs the calculation result.

Moreover, when the aforementioned device simulation method is realized by the software, the simulation program may be stored in a recording medium such as a floppy disk, CD-ROM, and the recording medium is read and executed by a computer. The recording medium is not limited to a magnetic disk, optical disk or another mobile medium, and fixed type recording mediums such as a hard disk drive and memory may be used. Furthermore, this type of simulation program may be distributed via Internet or another communication circuit (including radio communication). Additionally,this type of simulation program may be distributed via a cable circuit such as Internet or radio circuit, or in the recording medium in an encoded, modulated, or compressed state.

What is claimed is:

1. A device simulation method comprising:

calculating a band gap narrowing of a semiconductor and an ionization rate of an impurity in an equilibrium state;

calculating a movable electric charge density contributing to transportation of an electric charge inside the semiconductor by solving a Poisson equation and a movable electric charge continuous equation based on the calculated ionization rate in the equilibrium state;

calculating said band gap narrowing and said ionization rate in a non-equilibrium state, taking presence of a potential into consideration, based on the calculated movable electric charge density; and repeating the calculation of the movable electric charge density by solving the Poisson equation and the movable electric charge continuous equation based on the ionization rate and the band gap narrowing in said non-equilibrium state, and the calculation of said band gap narrowing and said ionization rate based on the calculation result, until the ionization rate and the band gap narrowing in said non-equilibrium state converge.

2. The device simulation method according to claim 1, wherein when carrying out the calculation of said band gap narrowing and said ionization rate, and the repetition of the calculation of said band gap narrowing and said ionization rate, said band gap narrowing and the ionization rate of the impurity are treated as a function of a potential.

3. The device simulation method according to claim 1, wherein an inside of the semiconductor contacted with a plurality of electrodes is cut off into a plurality of micro solids contacted with each other; and the Poisson equation and the movable electric charge continuous equation are repeatedly calculated for each of the micro solids, in accordance with a temperature and an impurity density applied to each of the micro solids, taking a current and a potential relating to the micro solids into consideration.

4. The device simulation method according to claim 1, wherein the Poisson equation and the movable electric charge continuous equation are repeatedly calculated in a state in which a current flows through the semiconductor, or in a state in which a voltage is applied to the semiconductor.

5. The device simulation method according to claim 1, wherein when repeating the calculation of said band gap narrowing and said ionization rate, the movable electric charge density is calculated by solving the Poisson equation and the movable electric charge continuous equation, taking a value obtained by multiplying a ratio of a change of said ionization rate to a change of a potential structure of a semiconductor device by an impurity density into consideration as a part of a ratio of a change of a total electric charge amount in the semiconductor device.

6. The device simulation method according to claim 5, wherein when repeating the calculation of said band gap narrowing and said ionization rate, the movable electric charge density is calculated by solving the Poisson equation and the movable electric charge continuous equation, taking a difference between a value obtained by multiplying a ratio of a change of the ionization rate of a donor to a change of the potential by a donor density and a value obtained by multiplying a ratio of a change of the ionization rate of an acceptor to the change of the potential by an acceptor density into consideration.

7. The device simulation method according to claim 1, wherein when repeating the calculation of said band gap narrowing and said ionization rate, the band gap narrowing due to a quantum many-body effect and an impurity band are calculated.

8. A device simulation system comprising:

an initial calculator configured to calculate a band gap narrowing of a semiconductor and an ionization rate of an impurity in an equilibrium state;

a movable electric charge density calculator configured to calculate a movable electric charge density contributing to transportation of an electric charge inside the semiconductor by solving a Poisson equation and a movable electric charge continuous equation based on the calculated ionization rate in the equilibrium state;

a non-equilibrium state calculator configured to calculate said band gap narrowing and said ionization rate in a non-equilibrium state, taking presence of a potential into consideration, based on the calculated movable electric charge density; and a judging parts configured to judge whether or not the ionization rate and the band gap narrowing in said non-equilibrium state have converged, wherein said movable electric charge density calculator repeats the calculation of the movable electric charge density by solving the Poisson equation and the movable electric charge continuous equation, based on the ionization rate and the band gap narrowing in said non-equilibrium state, until the ionization rate and the band gap narrowing in said non-equilibrium state converge, and said non-equilibrium state calculator repeats the calculation of said band gap narrowing and said ionization rate based on a calculation result of said movable electric charge density calculator, until the ionization rate and the band gap narrowing in said non-equilibrium state converge.

9. The device simulation system according to claim 8, wherein said non-equilibrium state calculator treats said band gap narrowing and the ionization rate of the impurity as a function of a potential.

10. The device simulation system according to claim 8, wherein an inside of the semiconductor contacted with a plurality of electrodes is cut off into a plurality of micro solids contacted with each other; and said initial calculator, said movable electric charge density calculator and said non-equilibrium state calculator carry out the corresponding calculation processing for each of the micro solids, in accordance with a temperature and an impurity density applied to each of the micro solids, taking a current and a potential relating to the micro solids into consideration.

11. The device simulation system according to claim 8, wherein said initial calculator, said movable electric charge density calculator and said non-equilibrium state calculator carry out the corresponding calculation processing in a state in which a current flows through the semiconductor, or in a state in which a voltage is applied to the semiconductor.

12. The device simulation system according to claim 8, wherein said movable electric charge density calculator calculates the movable electric charge density by solving the Poisson equation and the movable electric charge continuous equation, taking a value obtained by multiplying a ratio of a change of said ionization rate to a change of a potential structure of a semiconductor device by an impurity density into consideration as a part of a ratio of a change of a total electric charge amount in the semiconductor device.

13. The device simulation system according to claim 12, wherein said movable electric charge density calculator calculates the movable electric charge density by solving the Poisson equation and the movable electric charge continuous equation, taking a difference between a value obtained by multiplying a ratio of the change of the ionization rate of a donor to a change of the potential by a donor density and a value obtained by a ratio of multiplying a change of the ionization rate of an acceptor to the change of the potential by an acceptor density into consideration.

14. The device simulation system according to claim 8, wherein said non-equilibrium state calculator calculates the band gap narrowing due to a quantum many-body effect and an impurity band.

15. The device simulation system according to claim 8, wherein said initial calculator calculates the band gap narrowing due to a quantum many-body effect and a impurity band.

16. A device simulation program to be executed by a computer, comprising:

calculating a band gap narrowing of a semiconductor and an ionization rate of an impurity in an equilibrium state;

calculating a movable electric charge density contributing to transportation of an electric charge inside the semiconductor by solving a Poisson equation and a movable electric charge continuous equation based on the calculated ionization rate in the equilibrium state;

calculating said band gap narrowing and said ionization rate in a non-equilibrium state, taking presence of a potential into consideration, based on the calculated movable electric charge density; and repeating the calculation of the movable electric charge density by solving the Poisson equation and the movable electric charge continuous equation based on the ionization rate and the band gap narrowing in said non-equilibrium state, and the calculation of said band gap narrowing and said ionization rate based on the calculation result, until the ionization rate and the band gap narrowing in said non-equilibrium state converge.

17. The device simulation program according to claim 16, wherein when carrying out the calculation of said band gap narrowing and said ionization rate, and the repetition of the calculation of said band gap narrowing and said ionization rate, said band gap narrowing and the ionization rate of the impurity are treated as a function of a potential.

18. The device simulation program according to claim 16, wherein an inside of the semiconductor contacted with a plurality of electrodes is cut off into a plurality of micro solids contacted with each other; and the Poisson equation and the movable electric charge continuous equation are repeatedly calculated for each of the micro solids, in accordance with a temperature and an impurity density applied to each of the micro solids, taking a current and a potential relating to the micro solids into consideration.

19. The device simulation program according to claim 16, wherein the Poisson equation and the movable electric charge continuous equation are repeatedly calculated in a state in which a current flows through the semiconductor, or in a state in which a voltage is applied to the semiconductor.

20. The device simulation program according to claim 16, wherein when repeating the calculation of said band gap narrowing and said ionization rate, the movable electric charge density is calculated by solving the Poisson equation and the movable electric charge continuous equation, taking a value obtained by multiplying a ratio of a change of said ionization rate to a change of a potential structure of a semiconductor device by an impurity density into consideration as a part of a ratio of a change of a total electric charge amount in the semiconductor device.

21. The device simulation program according to claim 20, wherein when repeating the calculation of said band gap narrowing and said ionization rate, the movable electric charge density is calculated by solving the Poisson equation and the movable electric charge continuous equation, taking a difference between a value obtained by multiplying a ratio of a change of the ionization rate of a donor to a change of the potential by a donor density and a value obtained by multiplying a ratio of a change of the ionization rate of an acceptor to the change of the potential by an acceptor density into consideration.

22. The device simulation program according to claim 16, wherein when repeating the calculation of said band gap narrowing and said ionization rate, the band gap narrowing due to a quantum many-body effect and an impurity band are calculated.

* * * * *